(12) United States Patent
Kandah et al.

(10) Patent No.: US 9,172,365 B2
(45) Date of Patent: Oct. 27, 2015

(54) METHOD AND CIRCUIT FOR CONTROLLING TURNOFF OF A SEMICONDUCTOR SWITCHING ELEMENT

(71) Applicants: Ibrahim S. Kandah, Novi, MI (US); Fred T. Brauchler, Canton, MI (US); Steven R. Everson, Gilbert, AZ (US)

(72) Inventors: Ibrahim S. Kandah, Novi, MI (US); Fred T. Brauchler, Canton, MI (US); Steven R. Everson, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 35 days.

(21) Appl. No.: 14/016,080

(22) Filed: Aug. 31, 2013

(65) Prior Publication Data

US 2015/0061750 A1    Mar. 5, 2015

(51) Int. Cl.
*H03K 17/04* (2006.01)
*H03K 17/082* (2006.01)
*H03K 17/16* (2006.01)

(52) U.S. Cl.
CPC ........ *H03K 17/0822* (2013.01); *H03K 17/0828* (2013.01); *H03K 17/166* (2013.01); *H03K 2217/0036* (2013.01)

(58) Field of Classification Search
CPC .......... H03K 17/04123; H03K 17/567; H03K 17/08142; H03K 17/0406; H03K 17/04126
USPC .................................................. 327/374–377
See application file for complete search history.

(56) References Cited

U.S. PATENT DOCUMENTS 6,097,582 A * 8/2000 John et al. ........................ 361/79

FOREIGN PATENT DOCUMENTS

| EP | 2256917 A | 12/2010 |
|---|---|---|
| JP | 4333802 B1 | 9/2009 |
| JP | 2009225631 A | 10/2009 |

* cited by examiner

*Primary Examiner* — Diana J Cheng
(74) *Attorney, Agent, or Firm* — The Mason Group Patent Specialists LLC; Valerie M. Davis

(57) ABSTRACT

A circuit performs a method for controlling turn-off of a semiconductor switching element. The method includes determining at least one operating parameter for the semiconductor switching element during an operating cycle and determining a gate discharge current based on the at least one operating parameter. The method further includes supplying the gate discharge current to a gate of the semiconductor switching element during a subsequent operating cycle to turn off the semiconductor switching element.

18 Claims, 4 Drawing Sheets

METHOD AND CIRCUIT FOR CONTROLLING TURNOFF OF A SEMICONDUCTOR SWITCHING ELEMENT

FIELD

The present disclosure relates generally to semiconductor switching elements and more particularly to a method and circuit for controlling turn-off of a semiconductor switching element.

BACKGROUND

A class of semiconductor switching elements called power semiconductor devices are used to aid in powering heavy loads, such as large appliances and motors for electric vehicles and hybrids, that require high currents, for instance in the hundreds of amperes. These semiconductor switching elements include devices such as Insulated Gate Bipolar Transistors (IGBTs) and power Metal-Oxide Semiconductor Field Effect Transistors (MOSFETs).

Overloading the semiconductor switching element during operation can be a concern. Particularly, exceeding a voltage rating across the current terminals of the device could permanently damage and/or destroy the device. One conventional technique of controlling the voltage across the current terminals of the semiconductor switching element is to couple a fixed resistance to a control terminal of the device. This fixed resistance can be set to prevent the voltage across the current terminals of the semiconductor switching element from exceeding its voltage rating. However, an undesirable effect is that the fixed resistance also fixes the turn-off speed of the semiconductor switching element, thereby, causing it to operate at lower than optimal turn-off speeds for a good portion of its operating time. The sub-optimal turn-off speeds lead to higher switching losses and a lower system efficiency.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
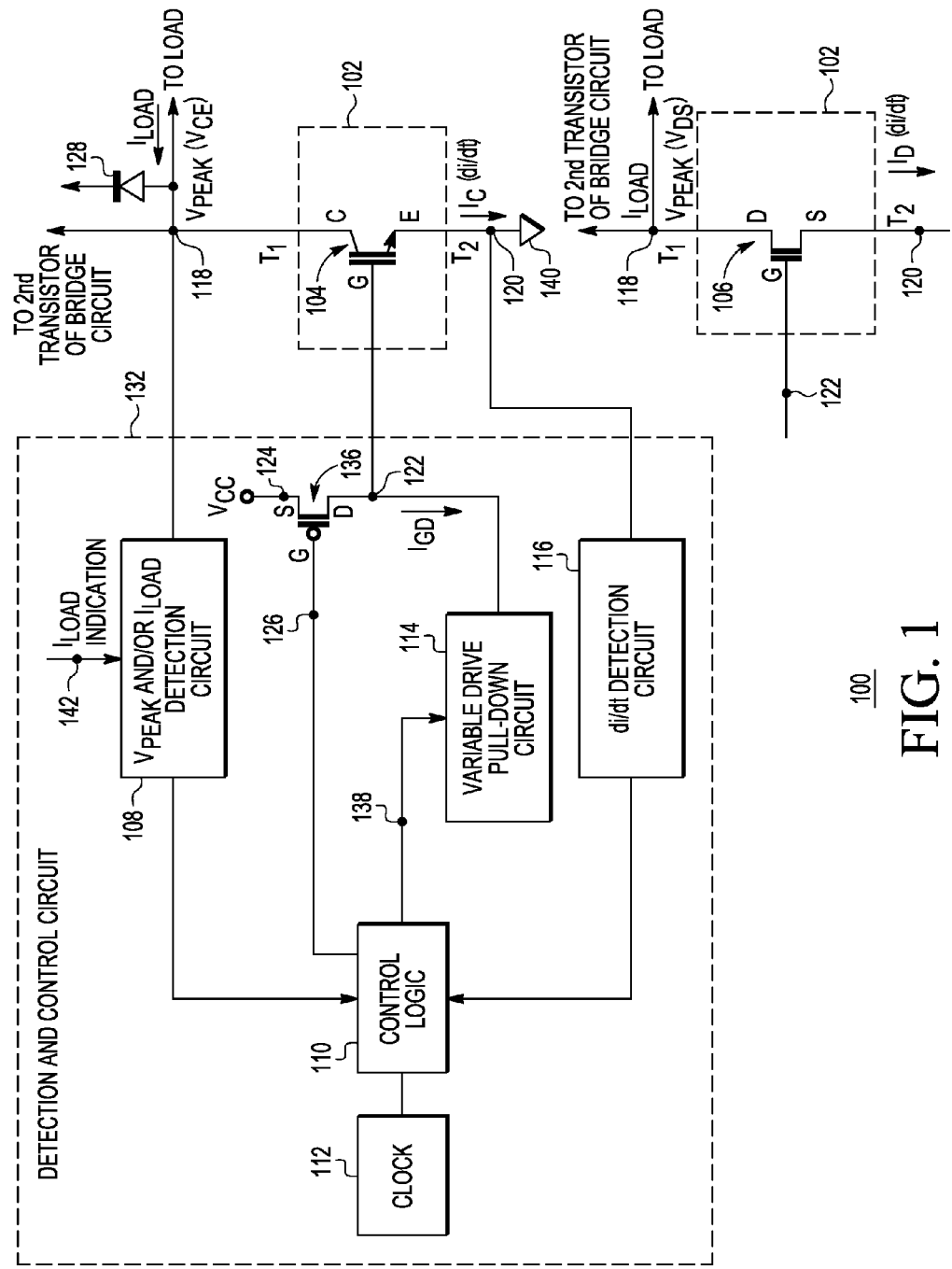
FIG. 1 is a circuit and block diagram illustrating a semiconductor switching element and a detection and control circuit to turn-off the semiconductor switching element in accordance with an embodiment.

The present disclosure is illustrated by way of example and is not limited by the accompanying figures, in which like reference numbers indicate similar elements. Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

The apparatus and method components have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein. Also, the functions included in the flow diagrams do not imply a required order of performing the functionality contained therein.

DETAILED DESCRIPTION

In accordance with the teachings herein is a method and circuit that reduces switching losses in semiconductor switching elements such as power IGBTs and MOSFETs. Particularly, the turn-off speed of the semiconductor switching element is dynamically adjusted to optimize the performance of the power semiconductor device in order to achieve the reduced switching losses.

In accordance with one embodiment is a method for controlling turn-off of a semiconductor switching element. The method includes determining at least one operating parameter for the semiconductor switching element during a first operating cycle and determining a control terminal discharge current based on the at least one operating parameter. The method further includes supplying the control terminal discharge current to a control terminal of the semiconductor switching element during a second subsequent operating cycle to turn off the semiconductor switching element.

In accordance with yet another embodiment is a circuit for controlling turn-off of a semiconductor switching element. The circuit includes a semiconductor switching element having first and second terminals and a control terminal and a detection and control circuit coupled to the control terminal of the semiconductor switching element. The detection and control circuit includes at least one detection circuit configured to determine at least one operating parameter for the semiconductor switching element during an operating cycle and control logic coupled to the at least one detection circuit. The control logic is configured to receive an indication of the at least one operating parameter and to determine a control terminal discharge current based on the at least one operating parameter. The detection and control circuit further includes a variable drive pull-down circuit coupled to the control logic and the semiconductor switching element. The variable drive pull-down circuit is configured to receive a control signal from the control logic to use in supplying the control terminal discharge current to the control terminal of the semiconductor switching element during a subsequent operating cycle to turn off the semiconductor switching element. In an embodiment, the one or more operating parameters are evaluated every operating cycle and adjustments made, if needed, to the control terminal discharge current during the following operating cycle, e.g., during the following semiconductor switching element turn-off event. In other embodiment, the operating parameter evaluations and discharge current adjustments are performed less frequently.

Turning now to a detailed description of at least some embodiments as illustrated by reference to the figures. FIG. 1 is a circuit and block diagram 100 illustrating a semiconductor switching element 102 and a detection and control circuit 132 to turn-off the semiconductor switching element in accordance with an embodiment. The detection and control circuit 132 is coupled to first and second current terminals $T_1$ and $T_2$ and to a control terminal G of the semiconductor switching element 102 at nodes 118, 120, and 122, respectively. In general, the control terminal can be a gate or base terminal depending on the particular transistor technology of the semiconductor switching element. A voltage or current applied to the control terminal G controls current flowing through the current terminals $T_1$ and $T_2$, which in turn controls current provided to a load device (not shown) coupled to the semiconductor switching element 102.

Figure 3:
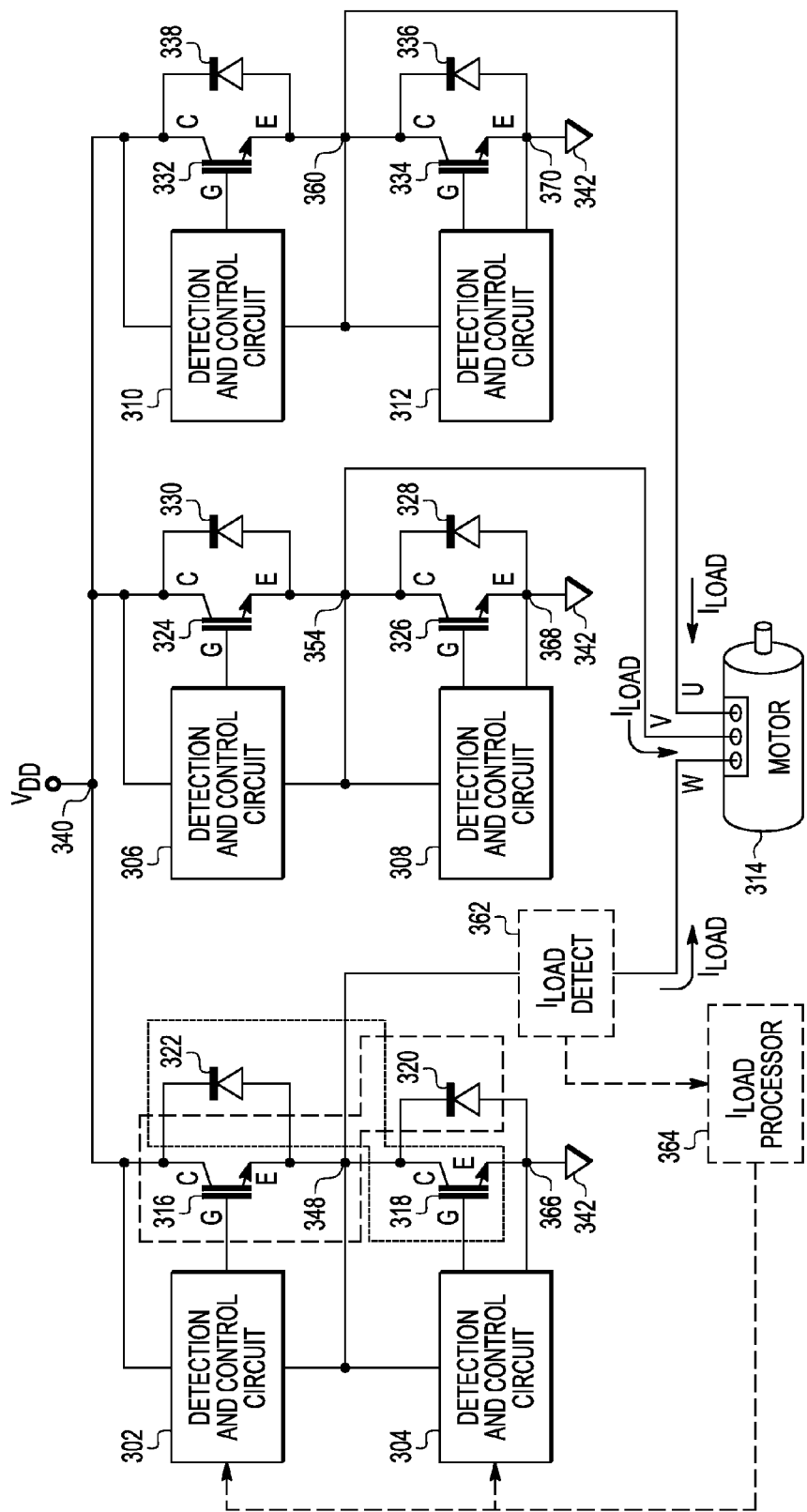
FIG. 3 is a circuit and block diagram illustrating a three-phase system used to power a motor, which incorporates the circuits shown in FIGS. 1 and 2 in accordance with an embodiment.

In one embodiment, the semiconductor switching element 102 is an IGBT 104 having a collector terminal or collector as the current terminal $T_1$, an emitter terminal or emitter as the current terminal $T_2$, and a gate terminal as the control terminal G. Accordingly, the control terminal is interchangeably referred to herein as a gate terminal or gate. In a further embodiment, a diode 128 is coupled between the collector terminal of the IGBT 104 and a direct current (DC) bus (not shown in FIG. 1), such as Vdd at a node 340 shown in FIG. 3. Diode 128 can be any suitable type of diode including, but not limited to, a p-n diode, a Schottky diode, etc. In a bridge circuit, for example, that includes the IGBT 104 and a second IGBT (not shown), an anode of the diode 128 is connected to the collector terminal of the IGBT 104, and a cathode of the diode 128 is connected to the DC bus. Such an arrangement is demonstrated between an IGBT 318 and a diode 322 (a "low" side a bridge circuit) shown in FIG. 3. FIG. 3 further shows a similar arrangement between an IGBT 316 and a diode 320 (e.g., a "high" side of the bridge circuit) shown in FIG. 3. The diode 128 (and 322) provide a current path for inductive current from a load (for instance a motor 314 shown in FIG. 3) when the semiconducting switching element 104 (318) turns OFF. The transient response time of this diode, when used, coupled with a parasitic lead inductance makes the control of switching speed of element 102 important. Reducing the switching speed of element 102 reduces the size of the voltage transient between node 118 and node 120 when switching element 102 is turned OFF. The diode 322 of FIG. 3 serves a similar function, as do each diode in FIG. 3 for its corresponding IGBTs.

Accordingly, the IGBT 104 is further coupled at the node 118 to a load device also simply called a load (not shown in FIG. 1) and acts as a switch to enable or allow provision of a load current $I_{load}$ to power the load. In an embodiment, the node 118 is also coupled to a second IGBT (not shown) such that the two IGBTs are arranged in a bridge configuration, as illustrated for example in FIG. 3, for providing $I_{load}$. Moreover, in this illustrated embodiment, the node 120 is further coupled to a voltage common 140 that is at a lower voltage than a voltage supplied to the node 118 when the IGBT 104 is turned ON. For example, the voltage common is around 0 Volts (V), such as an electrical ground for a system that incorporates the circuitry illustrated at 100, for instance a system 300 shown in FIG. 3 and described later.

Embodiments of the present teachings are primarily described by reference to an IGBT, e.g., 104, as the semiconductor switching element 102. However, in an alternative embodiment, the semiconductor switching element 102 is implementing using a different type of power semiconductor device. The current detailed description also applies when the semiconductor switching element 102 is implementing using a different type of power semiconductor device. For example, the semiconductor switching element 102 can be implemented using a power MOSFET such as a power N-channel metal-oxide semiconductor (NMOS) transistor 106. In that embodiment, the current terminal $T_1$ is a drain terminal or drain, the current terminal $T_2$ is a source terminal or source, and the control terminal G is a gate terminal. As with the IGBT 104 embodiment, a diode (not shown) may be coupled to the NMOS transistor 106, with the anode connected to the source terminal of the NMOS transistor 106 and the cathode connected to the drain terminal of the NMOS transistor 106. Particularly, an anode of the diode would be connected to the drain terminal of the NMOS transistor 106, and a cathode of the diode would be connected to the DC bus. Alternatively, the body diode of the NMOS transistor 106 could serve the same purpose such that an external diode is not needed.

The detection and control circuit 132 as shown includes: a pull-up circuit, a variable drive pull-down circuit 114, a clock 112, control logic 110 coupled to the variable pull-down circuit 114 at a node 138, and detection circuits 108 and 116. The detection and control circuit 132 operates to switch the IGBT 104 ON to provide or contribute to the provision of $I_{load}$ and to switch the IGBT 104 OFF to eliminate the IGBT 104 contribution to $I_{load}$. The control logic 110 provides signal processing and control functions using any suitable configuration of hardware components housed on an integrated circuit (IC) and/or using one or more discrete components, for instance, to control the turn-on and turn-off operation of the semiconductor switching element 102. Timing of the operation of the control logic 110 is controlled by the clock 112, which can be, for instance, based on a system clock for a system that incorporates the circuitry illustrated at 100, such as the system 300 shown in FIG. 3.

In one embodiment, during a single operating cycle, the semiconductor switching element 102 is switched ON once and then OFF once. For example, the semiconductor switching element is pulse wave modulated ON and OFF at a switching frequency that is controlled by a microprocessor (not shown) or other circuits of the system to build a sine wave of current for powering the load. In one particular embodiment, switching the device 102 OFF and then ON is one operating cycle; and the next time the semiconductor switching element 102 is switched OFF starts a next operating cycle for this device. In another embodiment, switching the device 102 ON and then OFF is one operating cycle; and the next time the semiconductor switching element 102 is switched ON starts a next operating cycle for this device. In yet a further embodiment, switching the device 102 ON is in itself a single operating cycle; and the next time the semiconductor switching element 102 is switched OFF starts a next operating cycle for this device. Switching the IGBT ON and OFF is generally referred to as switching events and more particularly referred to, respectively, as turn-on and turn-off events of the semiconductor switching element 102.

During the turn-on event, the detection and control circuit 132 uses the control logic 110 and the pull-up circuit to turn the IGBT 104 ON. In this case, the pull-up circuit is implemented using a P-channel metal-oxide semiconductor (PMOS) transistor 136 having a source coupled to a voltage source (not shown) that provides a voltage Vcc at a node 124, a drain coupled to the node 122, and a gate coupled to the control logic 110 at a node 126. Vcc is set to a voltage sufficiently high to insure that the semiconductor switching element 102 is fully turned ON by the PMOS transistor 136. In the illustrated embodiment using the IGBT 104 as the semiconductor switching element 102, Vcc can be set at or around 15 V. However, Vcc may be less using the NMOS 106 as the semiconductor switching element 102.

In the illustrated configuration, the PMOS 136 is normally OFF. During the turn-on event, the control logic 110 provides a voltage control signal to the gate of the PMOS transistor 136 to turn ON this transistor. When the PMOS transistor 136 is fully conducting, the node 122 at the gate of the IGBT 104 is pulled up to Vcc, which turns the IGBT 104 ON. While ON, the IGBT 104 conducts a current $I_c$ through the collector and emitter, to provide the load current $I_{load}$ to the load. Alternatively, when the semiconductor switching element 102 is implemented as the NMOS transistor 106, device 102 conducts a current $I_D$ through the drain and source, to provide the load current $I_{load}$ to the load, when the NMOS transistor 106 is ON.

During the turn-off event, the detection and control circuit 132 uses the control logic 110, the variable drive pull-down circuit 114, and the detection circuits 108 and 116 to turn the IGBT 104 OFF. Accordingly, the variable drive pull-down circuit 114 and each detection circuit 108 and 116 is coupled to the control logic 110 and to the semiconductor switching element 102, which in this case is the IGBT 104. In general, during the turn-off event, the control logic 110 provides a control signal to the PMOS transistor 136 that turns this transistor OFF and brings the voltage at the node 122 back down toward a lower voltage level, such as 0V or less, for instance −10V. This in turn begins to turn the semiconductor switching element 102 OFF. However, due to limitations inherent in the semiconductor switching element 102, this device is not a perfect switch that can be turned OFF, or ON for that matter, instantaneously.

The control logic 110 controls the variable drive pull-down circuit 114 in accordance with the present teachings to provide a discharge or turn-off current $I_{GD}$ at the gate of the semiconductor switching element 102 to control the turn-off of this device. The time needed to fully turn the semiconductor switching element 102 OFF, where virtually no current is conducting, creates switching losses in the device 102. Accordingly, the faster the device 102 is turned OFF, the lower the switching losses; and the slower the device 102 is turned OFF, the higher the switching losses. Although lower switching losses are generally desired, a faster turn-off of the semiconductor switching element 102 could cause the device to operate outside of a safe operating area (SOA) for the device, thereby, potentially destroying the device.

Generally, with respect to a power semiconductor device, the SOA is defined as the current-voltage boundary within which the power semiconductor device can be operated without destructive failure. Particularly, with respect to the IGBT, e.g., 104, the SOA is defined by a maximum collector-emitter voltage $V_{CE}$, and is also defined by a maximum collector current $I_c$, within which the IGBT must be confined to protect it from damage. The maximum $I_c$ during turn-off of the IGBT is related to its nominal current, maximum $I_{load}$. In addition, the maximum $I_{load}$ for a given system is dependent on the stray inductance of that system and the max voltage rating (e.g., maximum collector-emitter voltage $V_{CE}$) of the semiconductor switching element 102. Thus, the parameter $I_{load}$ determined while the IGBT is ON can provide an indication as to how close the IGBT is operating to its maximum $I_c$. Accordingly, knowing $I_{load}$ provides an indication of whether the variable pull-down circuit 114 should increase or decrease the discharge current. Particularly, at lower load currents measured during one operating cycle, the variable drive pull-down circuit 114 can turn the IGBT 104 OFF faster during a next operating cycle without damaging the device. The semiconductor switching element 102 presents itself to the variable drive pull-down circuit 114 as a large capacitance. Therefore, a faster turn-off requires a higher current.

In addition, a peak value $V_{PEAK}$ of $V_{CE}$ during turn-off of the IGBT is represented by the equation $V_{PEAK}=V_{DC}+L_s*di/dt$, wherein $V_{DC}$ is the DC link voltage across the IGBT or the bridge circuit, $L_s$ is the stray inductance associated with the system or circuit containing semiconductor switching element 102, and di/dt is the change in the collector current $I_c$ over time during the turn-off event. Thus, the parameters $V_{PEAK}$ and di/dt determined during the turn-off event can provide an indication as to how close the IGBT is operating to its maximum $V_{CE}$. Moreover, at lower $V_{PEAK}$ and di/dt determined during one operating cycle, the IGBT can be turned-off faster during a next operating cycle without damaging the device. Similarly, for the MOSFET, e.g., 106, the SOA is defined by a maximum drain-source voltage $V_{DS}$ and a maximum drain current $I_D$. Thus, any one or any combination of the parameters of $V_{PEAK}$, di/dt for $I_D$, or $I_{load}$ can be used to indicate how close the MOSFET is to operating outside the bounds of its SOA.

In accordance with the present teachings, the detection circuits 108 and/or 116 are configured to determine at least one operating parameter for the semiconductor switching element 102, e.g., the IGBT 104 or the MOSFET 106, during a first operating cycle. The operating parameter indicates how close the device 102 is to operating outside of its SOA and further indicates whether the device 102 should be driven faster or slower during a next or subsequent turn-off event to minimize switching losses and optimize performance of the device. In one particular embodiment, the detection circuit 108 is configured using any suitable sensing and processing circuitry to measure a peak voltage $V_{PEAK}$ between the first $T_1$ and second $T_2$ current terminals of the semiconductor switching element 102 and to provide an indication of the peak voltage $V_{PEAK}$ to the control logic 110 for use in adjusting a control terminal discharge current, e.g., $I_{GD}$, for the device 102. An example Vpeak detector could be implemented with a voltage comparator or a peak detector through some sort of level shifting either by resistor dividers or capacitive coupling.

In one example implementation, the detection circuit 108 is connected to the node 118 and to the control logic 110, measures and processes the voltage level at the node 118, and indicates the $V_{PEAK}$ detected at the node 118 to the control logic 110 for use in adjusting the control terminal discharge current $I_{GD}$. The control terminal discharge current $I_{GD}$ controls how quickly or slowly the semiconductor switching element 102 is turned OFF and, thereby, controls an amount of switching losses in the device 102. The larger the control terminal discharge current $I_{GD}$, the faster the turn-off and the lower the switching losses. Conversely, the smaller the control terminal discharge current $I_{GD}$, the slower the turn-off and the higher the switching losses.

In a further embodiment, the detection circuit 108 is configured using any suitable sensing and processing circuitry to determine the load current $I_{load}$ provided to a load circuit coupled to the semiconductor switching element 102 and to provide an indication of the load current to the control logic 110 for use in adjusting the control terminal discharge current $I_{GD}$. For instance, $I_{load}$ may already by measured in the system using current transducers, such as when $I_{load}$ is used by a microprocessor to run motor control algorithms. In one example implementation, the detection circuit 108 is connected to the node 118 and to the control logic 110, measures and processes $I_{load}$ at the node 118, and indicates $I_{load}$ to the control logic 110 for use in adjusting the control terminal discharge current $I_{GD}$. The sensing and processing circuitry can be wholly included within the circuitry 108, which is in turn connected to a single semiconductor switching element 102. Alternatively, when circuit 100 is part of a larger circuit, e.g., the circuit 300 of FIG. 3, part of the circuitry used to sense and process $I_{load}$, e.g., 362 and 364 of FIG. 3, can be external to the circuit 108 and coupled to multiple semiconductor switching elements. In the latter case, the external circuitry 362 and 364 are used to provide an indication of $I_{load}$ to the circuit 108 at a node 142, and the circuit 108 supplies the indication of $I_{load}$ in the same or a different format to the control logic 110.

In yet another embodiment, the detection circuit 116 is configured using any suitable sensing and processing circuitry to determine a first current over time di/dt in at least one of the first or second current terminals of the semiconductor switching element 102 and to provide an indication of the first current to the control logic for use in adjusting the control terminal discharge current. An example di/dt detector could be implemented using a series inductor element such as the parasitic stray inductance associated with the system or circuit containing semiconductor switching element 102 or a more precise inductor placed in series with the switching element 102, since the di/dt would then produce a voltage proportional to this inductance that can be measured using a voltage comparator. In one example implementation, the detection circuit 116 is connected to the node 120 and to the control logic 110, measures and processes the change in current di/dt at the node 120 during the turn-off event, and indicates di/dt detected at the node 120 to the control logic 110 for use in adjusting the control terminal discharge current.

In an embodiment, the detection circuits 108 and 116 provide an indication of the operating parameters $V_{PEAK}$, di/dt, and/or $I_{load}$ to the control logic 110 using a single bit. For example, the processing contained in the detection circuits 108 and 116 compares the particular operating parameter that it measures or determines to a corresponding threshold. When the operating parameter exceeds the threshold, the detection circuit indicates this using one bit, e.g., representing a logic 1, wherein the control logic 110 provides a control signal to the variable drive pull-down circuit 114 to dial back or reduce $I_{GD}$ during the next operating cycle, e.g., the next turn-off event. Conversely, when the operating parameter is below the threshold, the detection circuit indicates this using the other bit, e.g., representing a logic 0, wherein the control logic 110 provides a control signal to the variable drive pull-down circuit 114 to dial up or increase $I_{GD}$ during the next operating cycle, e.g., the next turn-off event. In another embodiment, the detection circuits 108 and 116 provide an indication of the operating parameters using multiple bits to convey additional information, such as how much the operating parameter has increased or decreased and/or how close the operating parameter is to the threshold. In yet another embodiment, the detection circuits 108 and 116 provide an indication of the operating parameters using an analog signal.

The variable drive pull-down circuit contains circuitry that receives the control signal from the control logic 110 at the node 138 and generates and supplies the control terminal discharge current $I_{GD}$ to the gate of the semiconductor switching element 102 during the turn-off event. $I_{GD}$ varies depending on the levels or magnitudes, or changes in the levels or magnitudes of the one or more operating parameters for the semiconductor switching circuit 102 determined during the previous operating cycle. An embodiment of the variable drive pull-down circuit 114 in accordance with the present teachings is illustrated in and described by reference to FIG. 2.

As illustrated, the variable drive pull-down circuit 114 includes an adjustable current mirror coupled at the node 122 to the control terminal of the semiconductor switching element 102 and coupled at the node 138 to the control circuit 110. In an embodiment, the adjustable current mirror operates to generate an adjustable reference current $I_{ADJ}$ and to copy or amplify the reference current $I_{ADJ}$ to produce or supply an adjustable output current, $I_{GD}$, to the semiconductor switching element 102. In accordance with the present teachings, the reference current $I_{ADJ}$, and hence the control terminal discharge current $I_{GD}$, is adjusted based on a control signal supplied at the node 138. The control signal provided to the adjustable current mirror is, in turn, determined based on at least one operating parameter, e.g., $V_{PEAK}$, di/dt, and/or $I_{load}$, detected during a previous operating cycle, thereby making $I_{GD}$ determined and set based on the least one operating parameter $V_{PEAK}$, di/dt, and/or $I_{load}$.

The adjustable current mirror includes an adjustable current source 206 and NMOS transistors 208, 212, and 214. The adjustable current source 206 is connected to the control logic 110 at the node 138 and connected to the drain and gate of the transistor 208 at a node 224. The source of the transistor 208 is connected to a voltage common, such as 0V, at a node 220. The drain of the transistor 212 is connected to the gate of the semiconductor switching element 102 at the node 122. The source of the transistor 212 is connected to the drain of the transistor 214 at a node 218, and the gate of the transistor 212 is connected to a node 216, which in one embodiment receives a control signal from the control logic 110. The source of the transistor 214 is connected to the voltage common at the node 220, and the gate of the transistor 214 is connected to the gate and drain of the transistor 208 at the node 224.

During the turn-off event for the semiconductor switching element 102, the adjustable current mirror generates the turn-off current $I_{GD}$ at the gate of the semiconductor switching element 102. At the beginning of the turn-off event, the adjustable current mirror is made active. Particularly, the adjustable current source 206 is configured to receive the control signal at the node 138 from the control logic 110 and to, in general, create the control terminal discharge current $I_{GD}$ that is applied to the control terminal of the semiconductor switching element 102. In the embodiment shown, $I_{GD}$ is created as a substantially square pulse.

During operation, the adjustable current source 206 receives the control signal from the control logic 110, wherein the control signal was determined based on the at least one operating parameter $V_{PEAK}$, di/dt, and/or $I_{load}$, and correspondingly sets the reference current $I_{ADP}$ based on the control signal, which thereby controls the magnitude of $I_{GD}$. In this manner, the switch is configured to apply the control terminal discharge current $I_{GD}$ as a pulse having a duration, in this case $d_2 = t_2 - t_1$, which is controlled by the control circuit and an amplitude that is controlled by the adjustable current source.

Plot 226 shows some example $I_{GD}$ pulses 232-240 generated by the adjustable current mirror and plotted along a $I_{GD}$ magnitude axis 228 versus the time axis 230. Each pulse has a duration $d_2 = t_2 - t_1$ that depends on the capacitance of the gate terminal of switching element 102, the magnitude of $I_{GD}$, and the voltage difference on the gate terminal between a fully on and a turn off threshold voltage. More particularly, the gate terminal of the semiconductor switching element 104 appears as a capacitor when turning the device 104 ON and OFF. The current, $I_{GD}$, represents the rate of charge being removed based on the equation Charge=$I_{GD}*d_2$. Accordingly, if $I_{GD}$ is lower, the duration $d_2$ is longer. Conversely, if $I_{GD}$ is higher, the duration $d_2$ is shorter.

Figure 2:
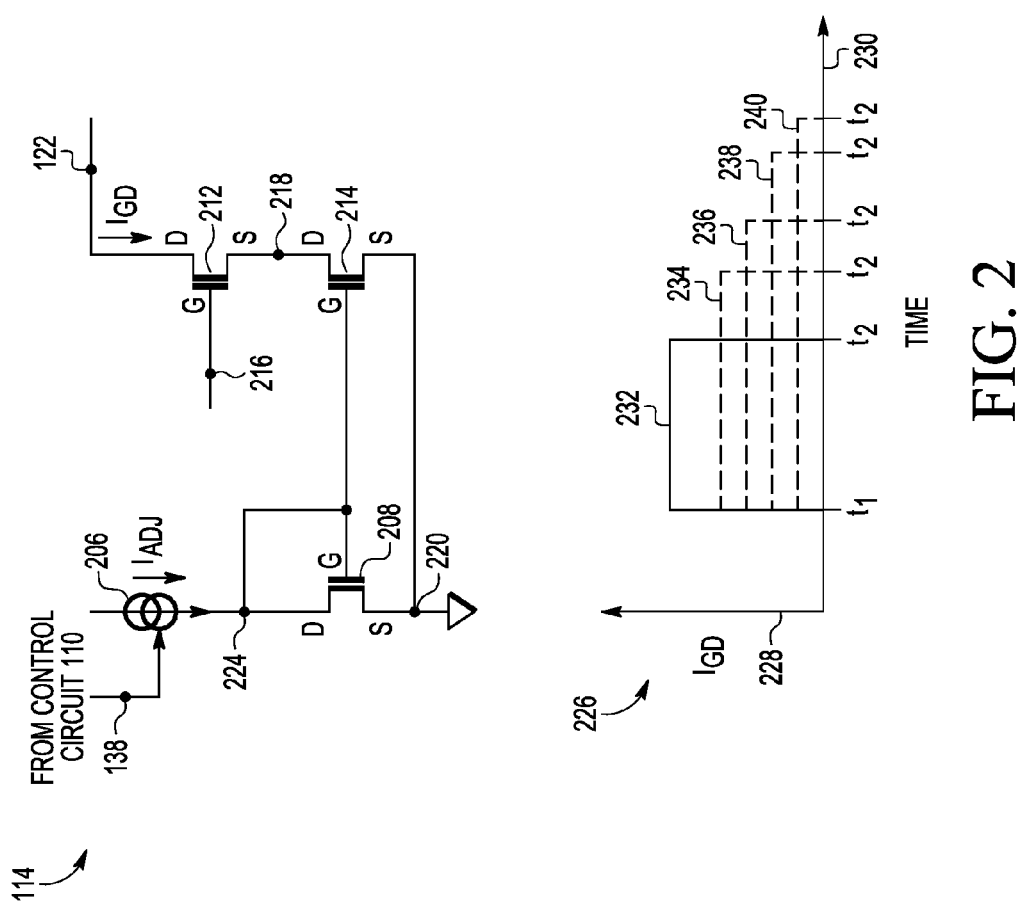
FIG. 2 is a circuit diagram illustrating an embodiment of a variable drive pull-down circuit within the detection and control circuit shown in FIG. 1.

FIG. 3 illustrates a system 300 that implements embodiments of: the circuit 100 having the IGBT 104 and the detection and control circuit 132 illustrated in FIG. 1; and the variable drive pull-down circuit 114 illustrated in FIG. 2. In an alternative embodiment, the system 300 includes power MOSFETs instead of IGBTs. Moreover, implementation of the IGBT 104 and the detection and control circuit 132 illustrated in FIG. 1 is not limited to the example implementation illustrated by references to FIG. 3 but can be implemented in other circuits and systems such as a switching voltage regulator for a switching power supply, by way of example. As shown, the system 300 includes a three-phase electric power generator that is coupled to and powers a load 314, which in this case is an electric motor. Each of the three phases of the electric power generator includes a circuit conductor containing a pair of IGBTs connected in a bridge configuration. The three circuit conductors generate three AC currents, $I_{load}$, of the same frequency and that reach their instantaneous peak values at one third of a cycle from each other.

More specifically, a first circuit conductor includes IGBTs 316 and 318 arranged in a bridge configuration. The IGBT 316 has a collector connected at a node 340 to a voltage source (not shown) that supplies a voltage Vdd, also referred to above as the DC bus, Vdd is implementation specific, and in an embodiment, Vdd can be set at a voltage in the range of 25V to 2500V. The emitter of the IGBT 316 is connected to the collector of the IGBT 318 at a node 348. The emitter of the IGBT 318 is connected to a voltage common 342 at a node 366. Optionally, a diode 322 is connected across the collector and emitter terminals of the IGBT 316; and a diode 320 is connected across the collector and emitter terminals of the IGBT 318, as shown. In addition, the IGBT 316 is connected to a detection and control circuit 302 at its gate, collector, and emitter; and the IGBT 318 is connected to a detection and control circuit 304 at its gate, collector, and emitter. In an embodiment, the circuits 302 and 304 are configured and coupled to the respective IGBTs as shown in and described by reference to FIGS. 1 and 2.

The second circuit conductor includes IGBTs 324 and 326 arranged in a bridge configuration. The IGBT 324 has a collector connected at the node 340 to the voltage source that supplies Vdd. The emitter of the IGBT 324 is connected to the collector of the IGBT 326 at a node 354. The emitter of the IGBT 326 is connected to the voltage common 342 at a node 368. Optionally, a diode 330 is connected across the collector and emitter terminals of the IGBT 324; and a diode 328 is connected across the collector and emitter terminals of the IGBT 326, as shown. In addition, the IGBT 324 is connected to a detection and control circuit 306 at its gate, collector, and emitter; and the IGBT 326 is connected to a detection and control circuit 308 at its gate, collector, and emitter. In an embodiment, the circuits 306 and 308 are configured and coupled to the respective IGBTs as shown in and described by reference to FIGS. 1 and 2.

The third circuit conductor includes IGBTs 332 and 334 arranged in a bridge configuration. The IGBT 332 has a collector connected at the node 340 to the voltage source that supplies Vdd. The emitter of the IGBT 332 is connected to the collector of the IGBT 334 at a node 360. The emitter of the IGBT 334 is connected to the voltage common 342 at a node 370. Optionally, a diode 338 is connected across the collector and emitter terminals of the IGBT 332; and a diode 336 is connected across the collector and emitter terminals of the IGBT 334, as shown. In addition, the IGBT 332 is connected to a detection and control circuit 310 at its gate, collector, and emitter; and the IGBT 334 is connected to a detection and control circuit 312 at its gate, collector, and emitter. In an embodiment, the circuits 310 and 312 are configured and coupled to the respective IGBTs as shown in and described by reference to FIGS. 1 and 2. Moreover, in an embodiment, each detection and control circuit 302-312 is coupled to an $I_{load}$ detection circuit 362 and $I_{load}$ processor 364 to measure, process, and provide an indication of $I_{load}$ at different points in time.

Figure 4:
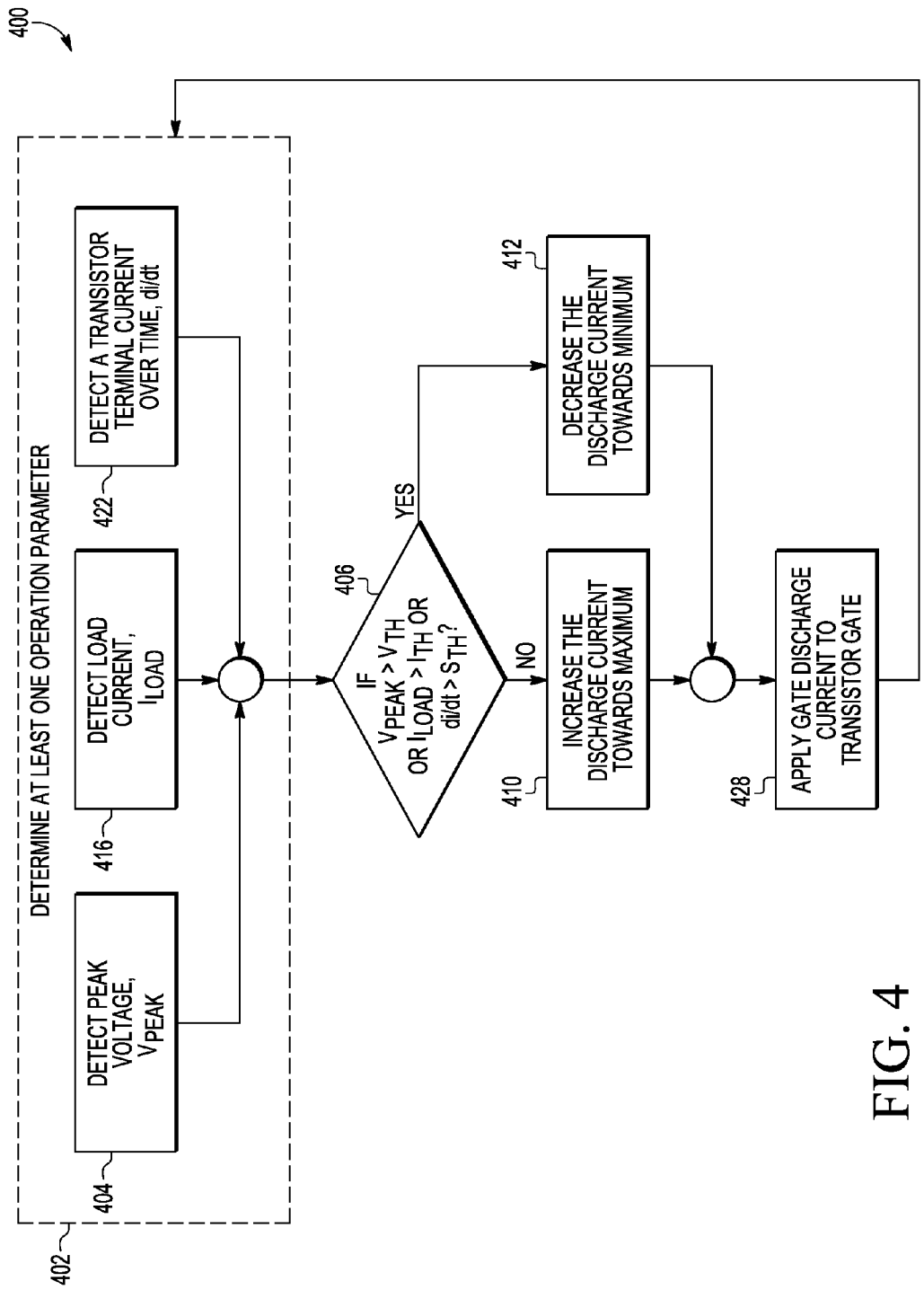
FIG. 4 is a flowchart illustrating a method for controlling turn-off of a semiconductor switching element in accordance with an embodiment.

Turning now to FIG. 4, illustrated therein is an example method 400 performed, for example, by the detection and control circuit 132, more particularly collectively by the control logic 110, the variable drive pull-down circuit 114, and the detection circuits 108 or 116, for controlling the turn-off switching event of the semiconductor switching element 102. At 402, the detection circuit 108 and/or 116 determines or detects at least one operating parameter for the semiconductor switching element 102. For example, determining 402 the at least one operating parameter includes determining 404 a peak voltage $V_{PEAK}$ across the semiconductor switching element 102 when turning the semiconductor switching element 102 OFF during a first operating cycle. More specifically, determining the peak voltage $V_{PEAK}$ across the semiconductor switching element 102 includes measuring a peak voltage between first and second current terminals, e.g., collector and emitter terminals or drain and source terminals, of the semiconductor switching element 102.

Alternatively, or in addition, determining 402 the at least one operating parameter includes determining 416, during the first operating cycle, a load current $I_{load}$ provided to a load circuit, e.g., the electric motor 314, coupled to the semiconductor switching element 102. Alternatively, or in addition, determining 402 the at least one operating parameter includes determining 422, during the first operating cycle, a current over time, di/dt, in a current terminal of the semiconductor switching element 102.

Accordingly, the method 400 can be performed based on any one or a combination of the operating parameters of the semiconductor switching element 102 including, but not limited to: $V_{PEAK}$; di/dt; and/or $I_{load}$. In general, the detection and control circuit 132 determines the control terminal discharge current $I_{GD}$ based on the at least one operating parameter by: comparing 406 the at least one operating parameter to a threshold; and adjusting the control terminal discharge current $I_{GD}$ based on the comparing. In an embodiment, adjusting $I_{GD}$ includes: decreasing 412 the control terminal discharge current when the at least one operating parameter is outside of a first threshold range; or increasing 410 the control terminal discharge current when the at least one operating parameter is within the first threshold range. The variable drive pull-down circuit then applies 428 the gate discharge current to the gate of the semiconductor switching element 102.

In one particular embodiment, the threshold range is a single threshold value. In such a case, the operating parameter is outside of the threshold range when the operating parameter exceeds 406 the threshold value, and $I_{GD}$ is correspondingly decreased 412. Similarly, the operating parameter is within the threshold range when the operating parameter is below 406 the threshold value, and $I_{GD}$ is correspondingly increased 410.

In an alternative embodiment, the threshold range comprises multiple threshold values bounded by a maximum threshold value and a minimum threshold value. In such a case, the operating parameter is outside of the threshold range when the operating parameter exceeds 406 any of the threshold values included in the threshold range, and $I_{GD}$ is correspondingly decreased 412. Similarly, the operating parameter is within the threshold range when the operating parameter is below 406 the minimum threshold value, and $I_{GD}$ is correspondingly increased 410. Using multiple threshold values provides additional flexibility in optimizing $I_{GD}$ based on the measured operating parameter. For example, where the operating parameter falls between the maximum and minimum threshold values, $I_{GD}$ is decreased toward a minimum $I_{GD}$ value less dramatically, such as by incrementally decreasing $I_{GD}$ toward the minimum $I_{GD}$ value. Whereas, where the operating parameter exceeds the maximum threshold value, $I_{GD}$ may be decreased toward the minimum $I_{GD}$ value more dramatically, such by immediately setting $I_{GD}$ to the minimum $I_{GD}$ value.

In the particular methodology 400 illustrated in FIG. 4, all three operating parameters $V_{PEAK}$; di/dt; and/or $I_{load}$ are considered in adjusting $I_{GD}$. Specifically, $V_{PEAK}$ is compared 406 to a threshold range $V_{TH}$. $I_{load}$ is compared 406 to a threshold range $I_{TH}$. Di/dt is compared 406 to a threshold range $S_{TH}$. In one embodiment, if any one or more of the operating parameters exceeds the respective threshold range, $I_{GD}$ is decreased 412 toward a minimum discharge current. However, if all of the operating parameters are below the respective threshold range, $I_{GD}$ is increased 410 toward a maximum discharge current.

With respect to the operating parameter $V_{PEAK}$, for example, after detecting $V_{PEAK}$, circuit 132 compares 406, to the threshold range $V_{TH}$, the peak voltage $V_{PEAK}$ between the first and second current terminals of the semiconductor switching element 102 and determines whether $V_{PEAK}$ is within (e.g., less than) or outside of (e.g., exceeds) the threshold range $V_{TH}$. In one particular embodiment, $V_{TH}$ is set at some value or values less than the maximum collector-emitter voltage $V_{CE}$ or the maximum drain-source voltage $V_{DS}$ for the device 102, taking into account the stray inductance determined within the circuit containing the device 102. Moreover, where $V_{TH}$ comprises multiple threshold values, $V_{TH}$ is set to maintain the semiconductor switching element 102 within its SOA.

The comparing can be performed in the detection circuit 108 or the control circuit 110. In this embodiment, control circuit 110 determines to increase 410 the control terminal discharge current $I_{GD}$ when the peak voltage $V_{PEAK}$ is within the threshold range $V_{TH}$; or decrease 412 the control terminal discharge current $I_{GD}$ when the peak voltage $V_{PEAK}$ is outside of the threshold range $V_{TH}$. The control circuit 110 then provides a control signal to the variable drive pull-down circuit 114 to apply 428 the control terminal discharge current $I_{GD}$ to the transistor 102 control terminal during the next turn-off event. In this manner, the detection and control circuit 132 optimizes the switching of the semiconductor switching element 102 during the turn-off event.

In one embodiment, the control terminal discharge current $I_{GD}$ is incrementally increased toward a predetermined maximum control terminal discharge current $I_{GD}$ while the at least one operating parameter is within the first threshold range, e.g., $V_{TH}$. For instance, the control terminal discharge current $I_{GD}$ is a pulse used to turn off the semiconductor switching element 102; and such incremental increases can, for instance, correspond to increasing $I_{GD}$ in accordance with the pulses shown at 240-232 of FIG. 2 toward a maximum $I_{GD}$ of 232. In a further embodiment, the control terminal discharge current $I_{GD}$ is decreased to a predetermined minimum control terminal discharge current, e.g., the pulse 240, upon detecting that the at least one operating parameter is outside of the first range of the threshold. Accordingly, increasing the control terminal discharge current $I_{GD}$ includes supplying a larger amplitude and shorter duration pulse; and decreasing the control terminal discharge current $I_{GD}$ includes supplying a smaller amplitude and longer duration pulse. For a more complicated implementation, the control logic 110 could apply an algorithm or a detailed table to determine how much to increase or decrease $I_{GD}$. In one example embodiment that considers multiple operating parameters such as $V_{PEAK}$; di/dt; and $I_{load}$, the threshold is a multi-valued threshold that takes into consideration the relationship between the three operating parameters. For instance, a much higher $I_{load}$ might be tolerated in the presence of a lower $V_{PEAK}$.

Likewise, with respect to the operating parameter $I_{load}$, after detecting $I_{load}$, circuit 132 compares 406, to a threshold range $I_{TH}$, the load current $I_{load}$ provided to a load circuit, e.g., 314, coupled to the semiconductor switching element 102 and determines whether $I_{load}$ is within (e.g., less than) or outside of (e.g., exceeds) the threshold range $I_{TH}$. In this embodiment, control circuit 110 determines to increase 410 the control terminal discharge current $I_{GD}$ when the load current $I_{load}$ is within the threshold range $I_{TH}$; or decrease 412 the control terminal discharge current $I_{GD}$ when the load current $I_{load}$ is outside of the threshold range $I_{TH}$. The control circuit 110 then provides a control signal to the variable drive pull-down circuit 116 to apply 428 the control terminal discharge current $I_{GD}$ to the transistor 102 control terminal during the next turn-off event.

Similarly, with respect to the operating parameter di/dt, after detecting di/dt, circuit 132 compares 406, to a threshold range $S_{TH}$, the first current determined over time di/dt in a current terminal of the semiconductor switching element 102 and determines whether di/dt is within (e.g., less than) or outside of (e.g., exceeds) the threshold range $S_{TH}$. In this embodiment, control circuit 110 determines to increase 410 the control terminal discharge current $I_{GD}$ when di/dt is within the threshold range $S_{TH}$; or decrease 412 the control terminal discharge current $I_{GD}$ when di/dt is outside of the threshold range $S_{TH}$. The control circuit 110 then provides a control signal to the variable drive pull-down circuit 116 to apply 428 the control terminal discharge current $I_{GD}$ to the transistor 102 control terminal during the next turn-off event.

In the foregoing specification, specific embodiments have been described. However, one of ordinary skill in the art appreciates that various modifications and changes can be made without departing from the scope of the disclosure as set forth in the claims below. Accordingly, the specification and figures are to be regarded in an illustrative rather than a restrictive sense, and all such modifications are intended to be included within the scope of present teachings. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendment made during the pendency of this application and all equivalents of those claims as issued.

For the sake of brevity, conventional techniques related to semiconductor fabrication including those using conventional CMOS technology, CMOS devices, IGBTs, current mirrors, electric motors, bridge circuits, three-phase systems, and other functional aspects of a system or IC, and the individual system or IC operating components, may not be described in detail. Furthermore, the connecting lines shown in the various figures contained herein are intended to represent example functional relationships and/or physical couplings between the various elements. It should be noted that many alternative or additional functional relationships or physical connections may be present in a practical embodiment. Moreover, the various IC embodiments described above may be produced or fabricated using conventional semiconductor processing techniques, e.g., well known CMOS techniques. Further, a variety of well-known and common semiconductor materials may be used, e.g., traditional metals such as aluminum, copper, gold, etc., polysilicon, silicon dioxide, silicon nitride, silicon, and the like.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%.

As used herein, the term "configured to", "configured with", "arranged to", "arranged with", "capable of" and any like or similar terms means that referenced circuit elements have an internal physical arrangement such as by virtue of a particular transistor technology used and/or physical coupling and/or connectivity with other circuit elements in an inactive state. This physical arrangement and/or physical coupling and/or connectivity while in the inactive state enables the circuit elements to perform stated functionality while in the active state of receiving and processing various signals at inputs of the circuit elements to generate signals at the output of the circuit elements. A device or structure that is "configured" in a certain way is configured in at least that way, but may also be configured in ways that are not described.

As further used herein, a "node" means any internal or external reference point, connection point, junction, signal line, conductive element, or the like, at which a given signal, logic level, voltage, data pattern, current, or quantity is present. Furthermore, two or more nodes may be realized by one physical element, and two or more signals can be multiplexed, modulated, or otherwise distinguished even though received or output at a common node.

The above description refers to nodes or features being "connected" or "coupled" together. As used here and, unless expressly stated otherwise, "coupled" means that one node or feature is directly or indirectly joined to or is in direct or indirect communication with another node or feature, and not necessarily physically. As used herein, unless expressly stated otherwise, "connected" means that one node or feature is directly joined to or is in direct communication with another node or feature. For example, a switch may be "coupled" to a plurality of nodes, but all of those nodes need not always be "connected" to each other; moreover, the switch may connect different nodes to each other depending on the state of the switch. Furthermore, although the various circuit schematics shown herein depict certain example arrangement of elements, additional intervening elements, devices, features, or components may be present in an actual embodiment, assuming that the functionality of the given circuit is not adversely affected.

In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A method for controlling turn-off of a semiconductor switching element, the method comprising:
   determining at least one operating parameter for the semiconductor switching element during a first operating cycle;
   generating, by a variable drive pull-down circuit, a control terminal discharge current having a magnitude that is adjusted higher or lower based on the at least one operating parameter;
   supplying, by the variable drive pull-down circuit, the control terminal discharge current to a control terminal of the semiconductor switching element during a second subsequent operating cycle to increase or decrease a turn off speed of the semiconductor switching element based on the adjusted magnitude of the control terminal discharge current, wherein the variable drive pull-down circuit comprises an adjustable current mirror that includes an adjustable current source that is configured to receive a control signal and create the control terminal discharge current that is supplied to the control terminal of the semiconductor switching element.

2. The method of claim 1, wherein determining the at least one operating parameter comprises determining a peak voltage across the semiconductor switching element when turning the semiconductor switching element off during the first operating cycle.

3. The method of claim 2, wherein determining the peak voltage across the semiconductor switching element comprises measuring a peak voltage between first and second current terminals of the semiconductor switching element.

4. The method of claim 1, wherein determining the at least one operating parameter comprises determining, during the first operating cycle, a load current provided to a load circuit coupled to the semiconductor switching element.

5. The method of claim 1, wherein determining the at least one operating parameter comprises determining, during the first operating cycle, a current over time in a current terminal of the semiconductor switching element.

6. The method of claim 1, wherein generating the control terminal discharge current having a magnitude that is adjusted higher or lower based on the at least one operating parameter comprises:
   comparing the at least one operating parameter to a threshold range;
   adjusting the magnitude of the control terminal discharge current higher or lower based on the comparing.

7. The method of claim 6, wherein the comparing and adjusting comprises:
   comparing, to the threshold range, a peak voltage between first and second current terminals of the semiconductor switching element;
   decreasing the magnitude of the control terminal discharge current when the peak voltage is outside of the threshold range;
   increasing the magnitude of the control terminal discharge current when the peak voltage is within the threshold range.

8. The method of claim 6, wherein the comparing and adjusting comprises:
   comparing, to the threshold range, a first current determined over time in a current terminal of the semiconductor switching element;

decreasing the magnitude of the control terminal discharge current when the first current is outside of the threshold range;

increasing the magnitude of the control terminal discharge current when the first current is within the threshold range.

9. The method of claim 6, wherein the comparing and adjusting comprises:

comparing, to the threshold range, a load current provided to a load circuit coupled to the semiconductor switching element;

decreasing the magnitude of the control terminal discharge current when the load current is outside of the threshold range;

increasing the magnitude of the control terminal discharge current when the load current is within the threshold range.

10. The method of claim 6, wherein the adjusting comprises:

decreasing the magnitude of the control terminal discharge current when the at least one operating parameter is outside of the threshold range;

increasing the magnitude of the control terminal discharge current when the at least one operating parameter is within the threshold range.

11. The method of claim 10, wherein the magnitude of the control terminal discharge current is incrementally increased toward a predetermined maximum control terminal discharge current while the at least one operating parameter is within the threshold range.

12. The method of claim 10, wherein the magnitude of the control terminal discharge current is decreased to a predetermined minimum control terminal discharge current upon detecting that any one of the at least one operating parameters is outside of the threshold range.

13. The method of claim 10, wherein the control terminal discharge current comprises a pulse, and wherein:

increasing the magnitude of the control terminal discharge current comprises supplying a larger amplitude and shorter duration pulse;

decreasing the magnitude of the control terminal discharge current comprises supplying a smaller amplitude and longer duration pulse.

14. A circuit for controlling turn-off of a semiconductor switching element, the circuit comprising:

a semiconductor switching element having first and second current terminals and a control terminal;

a detection and control circuit coupled to the control terminal of the semiconductor switching element, wherein the detection and control circuit comprises:

at least one detection circuit configured to determine at least one operating parameter for the semiconductor switching element during a first operating cycle;

control logic coupled to the at least one detection circuit, wherein the control logic is configured to receive an indication of the at least one operating parameter and to determine a control terminal discharge current having a magnitude that is adjusted higher or lower based on the at least one operating parameter;

a variable drive pull-down circuit coupled to the control logic and the semiconductor switching element, wherein the variable drive pull-down circuit is configured to receive a control signal from the control logic to use to generate and supply the control terminal discharge current to the control terminal of the semiconductor switching element during a second subsequent operating cycle to increase or decrease a turn off speed of the semiconductor switching element based on the adjusted magnitude of the control terminal discharge current, wherein the variable drive pull-down circuit comprises an adjustable current mirror coupled to the control terminal of the semiconductor switching element and to the control circuit, wherein the adjustable current mirror includes an adjustable current source that is configured to receive the control signal and create the control terminal discharge current that is applied to the control terminal of the semiconductor switching element.

15. The circuit of claim 14, wherein the semiconductor switching element comprises an insulated gate bipolar transistor or a metal-oxide semiconductor field effect transistor.

16. The circuit of claim 14, wherein the detection and control circuit comprises control logic and a detection circuit coupled to the control logic and to the semiconductor switching element, wherein the detection circuit is configured to measure a peak voltage between the first and second current terminals of the semiconductor switching element and to provide an indication of the peak voltage to the control logic for use in adjusting the control terminal discharge current.

17. The circuit of claim 14, wherein the detection and control circuit comprises control logic and a detection circuit coupled to the control logic and to the semiconductor switching element, wherein the detection circuit is configured to determine a first current over time in at least one of the first or second current terminals of the semiconductor switching element and to provide an indication of the first current to the control logic for use in adjusting the control terminal discharge current.

18. The circuit of claim 14, wherein the detection and control circuit comprises control logic and a detection circuit coupled to the control logic and to the semiconductor switching element, wherein the detection circuit is configured to determine a load current provided to a load circuit coupled to the semiconductor switching element and to provide an indication of the load current to the control logic for use in adjusting the control terminal discharge current.

* * * * *